(12) United States Patent
Kumakura et al.

(10) Patent No.: US 10,040,175 B2
(45) Date of Patent: Aug. 7, 2018

(54) FILM-LIKE MEMBER SUPPORT APPARATUS

(71) Applicant: SEMICONDUCTOR ENERGY LABORATORY CO., LTD., Atsugi-shi, Kanagawa-ken (JP)

(72) Inventors: Kayo Kumakura, Tochigi (JP); Satoru Idojiri, Tochigi (JP); Masakatsu Ohno, Tochigi (JP); Koichi Takeshima, Tochigi (JP); Yoshiharu Hirakata, Kanagawa (JP); Kohei Yokoyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 474 days.

(21) Appl. No.: 14/696,515

(22) Filed: Apr. 27, 2015

(65) Prior Publication Data

US 2015/0314424 A1    Nov. 5, 2015

(30) Foreign Application Priority Data

May 3, 2014    (JP) .................. 2014-095582

(51) Int. Cl.
| | | |
|---|---|---|
| *B25B 11/00* | (2006.01) | |
| *B29C 53/18* | (2006.01) | |
| *H01L 21/687* | (2006.01) | |
| *B29L 7/00* | (2006.01) | |

(52) U.S. Cl.
CPC ............ *B25B 11/005* (2013.01); *B29C 53/18* (2013.01); *H01L 21/6875* (2013.01); *H01L 21/68742* (2013.01); *B29L 2007/002* (2013.01)

(58) Field of Classification Search
CPC ................................................... B25B 11/005
See application file for complete search history.

(56) References Cited

U.S. PATENT DOCUMENTS

| 8,367,440 B2 | 2/2013 | Takayama et al. |
|---|---|---|
| 2015/0059986 A1 | 3/2015 | Komatsu et al. |
| 2015/0059987 A1 | 3/2015 | Kumakura et al. |

(Continued)

FOREIGN PATENT DOCUMENTS

| JP | H10-337503 | 12/1998 |
|---|---|---|
| JP | 2001-209192 A | 8/2001 |

(Continued)

OTHER PUBLICATIONS

International Search Report (Application No. PCT/IB2015/052801) dated Aug. 18, 2015.

(Continued)

*Primary Examiner* — Ryan Ochylski
(74) *Attorney, Agent, or Firm* — Nixon Peabody LLP; Jeffrey L. Costellia

(57) ABSTRACT

A film-like member is supported in a flat shape by vacuum suction. A plurality of lift pins are arranged in a planar configuration and bear a film-like member placed on their upper ends. Tubular pads made of rubber for holding the film-like member by vacuum suction are attached to upper portions of the lift pins. The height of the lift pins can be adjusted by a screw fastening mechanism. The deformation of the film-like member can be corrected to a flat or concavely curved shape by suction from the pads. When the correction cannot be achieved by suction alone, the correction may be supplemented by ejection of air from a nozzle.

13 Claims, 4 Drawing Sheets

(56) References Cited

U.S. PATENT DOCUMENTS

| | | |
|---|---|---|
| 2015/0060933 A1 | 3/2015 | Ohno et al. |
| 2015/0075720 A1 | 3/2015 | Hirakata et al. |
| 2015/0151531 A1 | 6/2015 | Ohno et al. |

FOREIGN PATENT DOCUMENTS

| | | |
|---|---|---|
| JP | 2005-022844 A | 1/2005 |
| JP | 2007-103609 A | 4/2007 |
| JP | 2011-066095 | 3/2011 |
| JP | 2013-041989 A | 2/2013 |
| JP | 2013-191601 A | 9/2013 |
| JP | 2013-216429 | 10/2013 |

OTHER PUBLICATIONS

Written Opinion (Application No. PCT/IB2015/052801) dated Aug. 18, 2015.

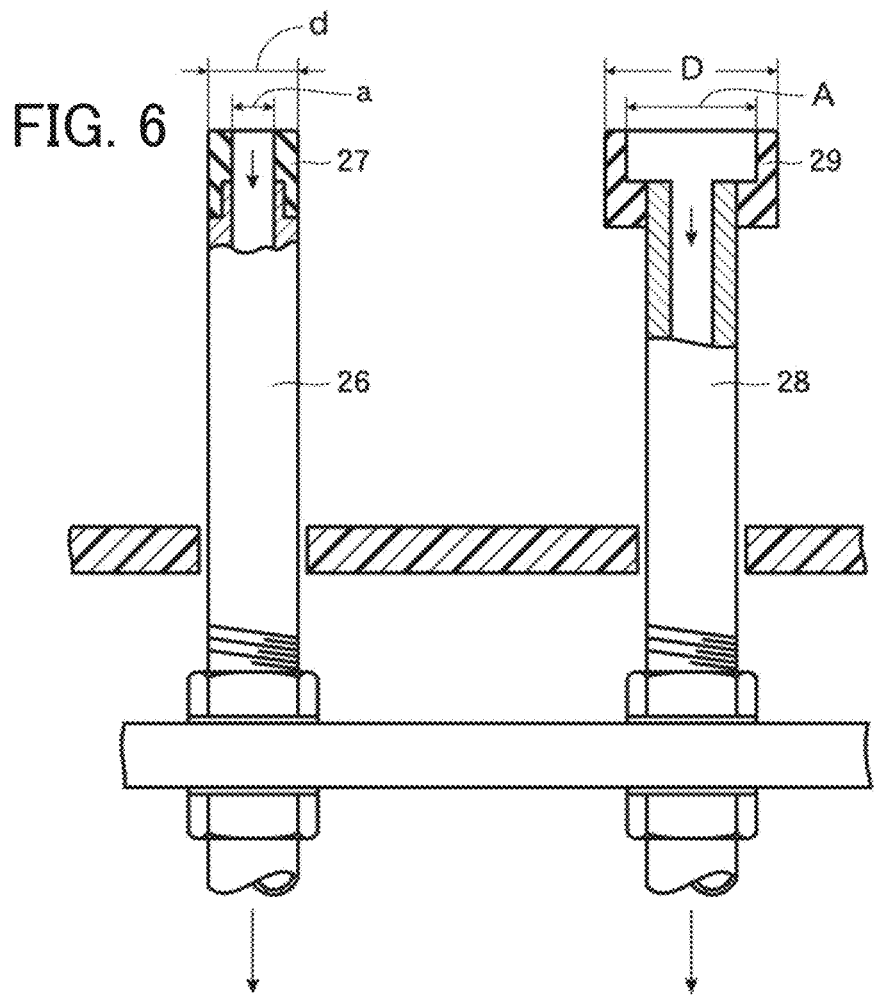

FILM-LIKE MEMBER SUPPORT APPARATUS

TECHNICAL FIELD

The present invention relates to a film-like member support apparatus. The present invention relates more specifically to a support apparatus for a plate-like product such as an electronic device, a support body made of a synthetic resin and included in the plate-like product, a partially finished product in the process of manufacturing the plate-like product, and a film-like member used for manufacturing.

BACKGROUND ART

In recent years, a flexible device in which a functional element such as a semiconductor element, a display element, or a light-emitting element is provided over a flexible substrate has been developed and put to practical use. Typical examples of the flexible device include a lighting device, an image display device, a variety of semiconductor circuits including a semiconductor element such as a transistor, and the like. In addition, a variety of methods for manufacturing these devices have been proposed. A front or back surface of a flexible component or device is covered with a film-like support body made of a synthetic resin, for example, for purposes such as protecting internal elements and ensuring flexibility. The flexible component or device is processed through a variety of steps of transferring (transporting) a film-like member which is a partially finished product, attaching the film-like member to another member, mounting a component on the film-like member, and the like and is manufactured using a variety of members. A film-like member which serves as a support body in a plate-like product such as a flexible device is covered with protective sheets on both sides and supplied from a roll. Therefore, when the film-like member is cut into a desired size and the protective sheet on one side is peeled, the film-like member is deformed by warping because of an imbalance of internal stress.

In order to smooth out creases in a band-like film moving in a longitudinal direction, a film crease removing apparatus for smoothing out creases continuously by blowing air from an air vent onto the band-like film is proposed (Patent Document 1). The film crease removing apparatus can smooth out creases in a band-like member but cannot smooth out creases or deformation of each cut film. In the case of a film-like member which is sensitive to damage, a surface to be held by a holding means is often only one predetermined surface. In other words, both surfaces of a film substrate cannot be held by a holding means such as a transfer hand.

Furthermore, in order to smooth out creases in a cut film substrate, a method and an apparatus for removing creases from the film substrate are proposed (Patent Document 2), in which air is expelled from a porous member on a stage, the film substrate is placed thereon to attach it by suction, and a pressing gas is blown from above the film substrate. The crease removing method and apparatus disclosed in Patent Document 2 smooth out creases in a film substrate by synchronously swinging a pair of blow outlet pipes provided with a plurality of ejection nozzles. This swing mechanism is complex and might cause a breakdown or the like; therefore, as simple a mechanism as possible is preferable. Furthermore, the crease removing method and apparatus can smooth out creases in a lower surface of a film substrate but cannot hold the lower surface of the film substrate with a transfer hand or the like because the lower surface of the film substrate is in contact with an upper surface of the porous member.

REFERENCES

[Patent Document 1] Japanese Published Patent Application No. 2011-66095

[Patent Document 2] Japanese Published Patent Application No. 2013-216429

DISCLOSURE OF INVENTION

The present invention was made in view of the above-described background and achieves the following object. An object of one embodiment of the present invention is to provide a film-like member support apparatus which is configured to be in contact with a film-like member to the minimum extent necessary for positioning the film-like member at a set position in a set shape. An object of another embodiment of the present invention is to provide a film-like member support apparatus capable of correcting the deformation of a film-like member.

A first embodiment of the present invention is a support apparatus for a film-like member having flexibility. The support apparatus includes a plurality of pads having a function of attaching a first surface of the film-like member thereto by suction, a plurality of first lift pins capable of stopping at a first extension amount, and a plurality of second lift pins capable of stopping at a second extension amount. The pads include an elastic member and are provided at end portions of the first lift pins and the second lift pins. The first surface of the film-like member is attached by suction to the pads.

A second embodiment of the present invention is the support apparatus for the film-like member of the first embodiment of the present invention in which the pads have different suction forces depending on the bearing position of the film-like member. A third embodiment of the present invention is the support apparatus for the film-like member of the first or second embodiment of the present invention in which the pads bear the first surface at points. A fourth embodiment of the present invention is the support apparatus for the film-like member of any one of the first to third embodiments of the present invention which includes a nozzle having a function of blowing pressurized air. The pads are capable of attaching the first surface of the film-like member thereto by suction while the nozzle is blowing the pressurized air onto a second surface of the film-like member.

The film-like member support apparatus of the present invention is configured to be in contact with the film film-like member to the minimum extent necessary and can therefore position the film-like member at a set position in a set shape without damage. Furthermore, the deformation of the film-like member can be corrected; therefore, a correction apparatus and a correction step do not need to be additionally provided.

BRIEF DESCRIPTION OF DRAWINGS

FIG. 6 is a partial cross-sectional view of pads over lift pins in Embodiment 3.

FIG. 7 is an explanatory diagram for Embodiment 3.

BEST MODE FOR CARRYING OUT THE INVENTION

Embodiment 1

Figure 1:
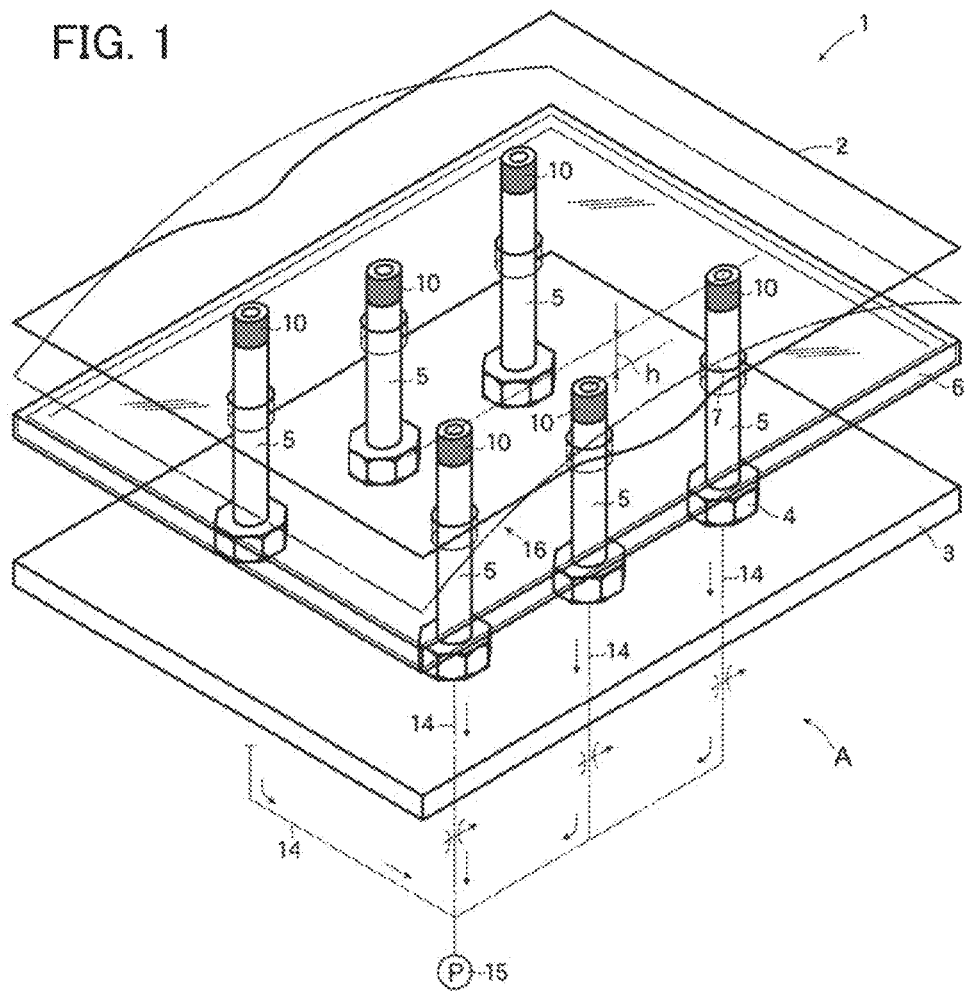
FIG. 1 is a three-dimensional external view illustrating a film-like member support apparatus in Embodiment 1 of the present invention.

A film-like member support apparatus in a first embodiment of the present invention (hereinafter referred to as a support apparatus 1) will be described below with reference to drawings. FIG. 1 is a three-dimensional external view illustrating the film-like member support apparatus 1 in Embodiment 1 of the present invention. The film-like member refers to a film-like (not necessarily flexible) object which is a plate-like component included in an electronic device such as a lighting device or an image display device, a partially finished product in the process of manufacturing the plate-like component, a film-like object used in manufacturing the plate-like component, or the like. This film-like member is transferred and moved between a variety of manufacturing processes and subjected to necessary processing. If the film-like member warps in the process, it is difficult to transfer the film-like member with its shape corrected to a flat shape. In the case where the processing times for the manufacturing processes vary, a stage for temporary standby and storage of these members is needed for time control.

In the case where different hands or fingers, which are holding means for transfer or processing, are used in different processes, it is necessary to provide a stage for temporarily placing the members for changing the holding means. The film-like member support apparatus of the present invention can support and position the film-like member at a set position and a set angle in a set shape in such a case, and can also correct the deformation of the film-like member. Note that the support apparatus in the present invention and this embodiment can be applied not only to manufacturing the above-described plate-like product but also to supporting a variety of film-like objects. In other words, the film-like member support apparatus 1 refers to a stage for standby for operations such as processing the film-like member and mounting components in the film-like member, a stage for changing a holding means to another transfer apparatus or robot hand for transfer (transportation) to the next process, a stage for temporary standby or storage for time control, or the like. Alternatively, it refers to a stage for changing the position or angle of the film-like member or correcting the deformation thereof. Therefore, the film-like member support apparatus 1 in the present invention or this embodiment is not limited by the following functions or intended uses described in Embodiment 1.

FIG. 1 illustrates an example of a state where a film-like member 2 is supported by the support apparatus 1. The film-like member 2 in an embodiment of the present invention and Embodiment 1 corresponds to a member such as a support body made of a synthetic resin, a partially finished product in the process of manufacturing a plate-like product, or any flexible film-like single-layer or stacked-layer member used in the process of manufacturing the plate-like product. As illustrated in FIG. 1, a lower surface of the film-like member 2 is supported by six lift pins (bearing pins) 5 in this example. The lift pins 5 are fixed to a frame 3 placed thereunder.

Figure 2:
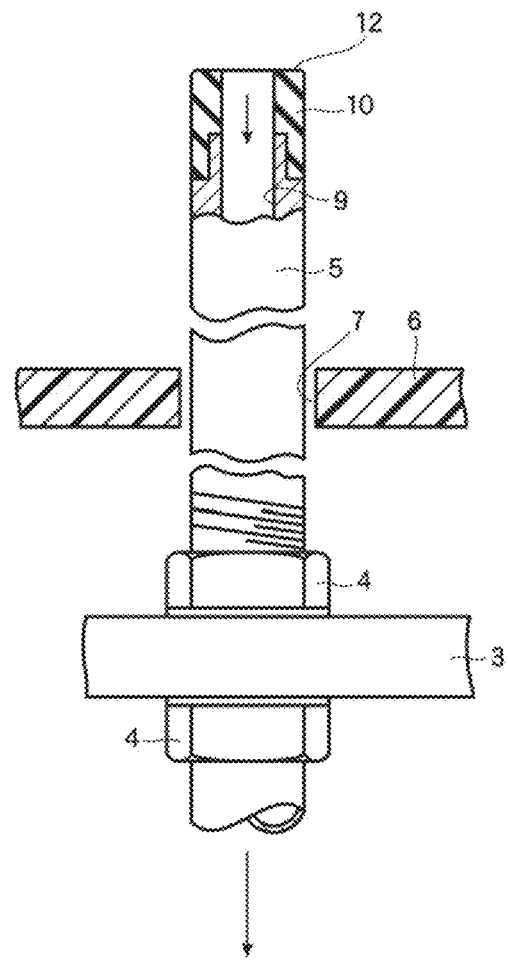
FIG. 2 is a partial cross-sectional view of a pad over a lift pin.

The frame 3 is a main body of the support apparatus 1. As illustrated in FIG. 2, for example, an external thread is formed on the periphery of a lower portion of each of the tubular lift pins 5, and a nut 4 is screwed onto the external thread. By the external thread and the nut 4, the lift pin 5 is fixed to the frame 3. Since the lift pin 5 has such a screw-fixing structure, the protruding height thereof from the frame 3 can be adjusted to a given height, and the lift pin can be adjusted removably and replaceably. Although the lift pins are fixed by screws in this example, an up-and-down mechanism based on a pneumatic cylinder capable of selecting among three positions, a clamp mechanism, or a cam mechanism may be used, for example. Although a height adjustment mechanism for adjusting the position of the lift pins 5 in the vertical direction is used in Embodiment 1, the film-like member 2 may be placed and held vertically (upright) when it is large.

In that case, the height adjustment mechanism serves as a mechanism for adjusting the length in the horizontal direction; thus, the protruding height of the lift pins is also referred to as an extension amount in the present invention and this embodiment. An upper portion of the lift pin 5 penetrates through a through-hole 7 formed in an upper plate stage 6. The upper plate stage 6 is fixed to the frame 3 by a fixing unit (not illustrated). In this example, the upper plate stage 6 is, but not limited to, a rectangular plate made of a transparent synthetic resin. The upper plate stage 6 is a stage for bearing the film-like member 2, and when the film-like member 2 is dropped for some reason, the upper plate stage 6 can receive the film-like member 2 at a close position. Unless the film-like member 2 is significantly deformed or the protruding height of the lift pins 5 is small, the film-like member 2 is not brought into contact with the upper plate stage 6.

FIG. 2 is a cross-sectional view of the upper portion of the lift pin 5. The lift pin 5 is a pipe having a through-hole 9 in the center. The through-hole 9 forms a pipe conduit for air suction from an upper end of the lift pin 5. A tubular pad 10 is fixedly attached to the upper portion of the lift pin 5. The through-hole 9 of the lift pin 5 and the pad 10 have the same inner diameter and are connected to each other. The pad 10 is an elastic member made of synthetic rubber, synthetic resin elastomer, or the like and can be changed in shape to some extent. An upper end surface 12 of the pad 10 bears the film-like member 2. The pad 10 is made of an elastic material and therefore does not damage the film-like member 2. In addition, the pad 10 can be changed in shape and therefore conforms to a deformed shape of the film-like member 2.

In Embodiment 1, six lift pins 5 are provided, all of which are normally set at the same height. However, in this example, two lift pins 5 located in the middle are set at a height lower by height h than that of the lift pins 5 at both ends. The through-hole 9 of each of the lift pins 5 is connected to a vacuum pump 15 by a pipe conduit 14. The pipe conduit 14 is provided with a throttle valve, a regulator, a pressure sensor, a check valve, or the like (not illustrated) as necessary. The throttle valve adjusts the force of suction of air from the pad 10. The throttling amount is fixed once adjusted depending on the type of the film-like member 2. In other words, the suction force for fixing the film-like member 2 by suction is constant. However, the present invention is not limited thereto, and the suction force is not necessarily constant.

Effect of Embodiment 1

In the above-described structure, the lower surface of the film-like member 2 is held by a holding hand (not illustrated) of a transfer apparatus and placed on the lift pins 5 of the support apparatus 1. At that time, each of the pads 10 withdraws air from the vicinity of the upper end surface 12 of the pad 10 by air suction by the vacuum pump 15. Therefore, when the film-like member 2 is placed close to the vicinity of the upper end surface, the film-like member 2 is attached by suction to the upper end surface 12 of the lift pin 5. As a result, the film-like member 2 is supported and fixed onto the upper end surface 12 of each of the six lift pins 5 such that the center thereof is downwardly curved as indicated by a solid line.

If there is no suction force from the pad 10, the film-like member 2 unwound from a roll, for example, normally curls up because the inner side thereof is under compressive stress and the outer side thereof is under tensile stress even after it is cut into a rectangular shape. As illustrated in FIG. 1, in the case where the film-like member 2 curls in a cylindrical shape without air suction from the pad 10, the film-like member 2 in the cylindrical (convexly curved) shape is placed on the lift pins 5 such that the middle thereof is high and both ends are low (an imaginary line in FIG. 1). Note that the film-like member 2 has a concavely curved shape when reversed.

Figure 3:
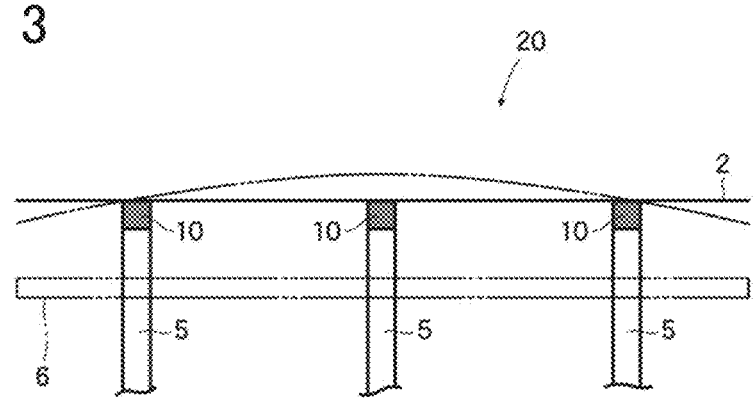
FIG. 3 is a side view seen from the direction A in FIG. 1.

However, as described above, owing to the six pads 10, the film-like member 2 is made slightly downwardly curved in the middle (the solid line in FIG. 1) and the curl is corrected in the opposite direction. In this manner, the cylindrical curl of the film-like member 2 can be corrected. As a result, the film-like member 2 in a flat shape can be handed over to the next process. In addition, there is a gap 16 which is a space between the film-like member 2 and the upper plate stage 6. Therefore, when the film-like member 2 is carried out, the film-like member 2 can be held in this gap 16 by suction pads provided on fingers of a fork-like transfer hand. At that time, an air nozzle to be described later may be used to eject pressurized air toward the film-like member in order to supplement the suction force of the transfer hand. In this regard, the gap 16 is effective in preventing damage when the upper surface of the film-like member 2 should not be touched for holding. FIG. 3 is a side view of a support apparatus 20 in a modification example of Embodiment 1. In the case where the cylindrical curl is not so intense (an imaginary line in FIG. 3), the lift pins 5 are set at the same height. By the suction force of the six pads 10, the curl of the film-like member 2 is corrected to a flat shape (a solid line).

Embodiment 2

Figure 4:
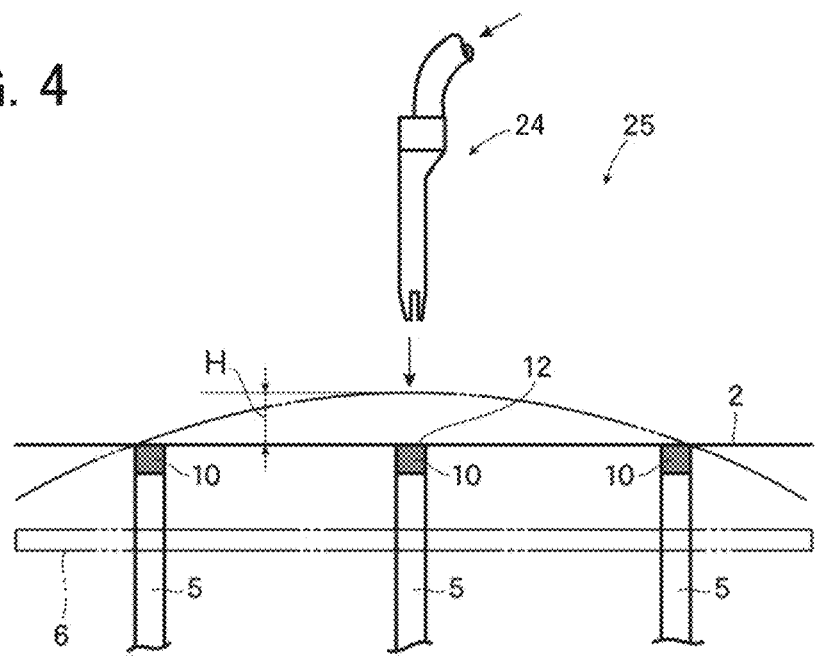
FIG. 4 is a side view illustrating a film-like member support apparatus in Embodiment 2 of the present invention.

FIG. 4 is a side view of a support apparatus 25 in Embodiment 2. When the film-like member 2 curls as described above or when a surface layer of the film-like member 2 is peeled in the case where the film-like member has a multilayer stacked structure, the film-like member 2 may be deformed because of an imbalance of internal stress. In the case where the deformation is significant, the middle portion may be at a distance of height H from the upper end surface 12 of the pad 10 as indicated by an imaginary line in FIG. 4, resulting in suction failure. Although the suction force can be set strong in such a case, a suction force stronger than or equal to a certain set value might cause damage to delicate internal elements of the film-like member 2 or cause plastic deformation of a support body made of a synthetic resin or the like.

Therefore, the suction force cannot be set stronger than or equal to an allowable value. In such a case, the suction force is supplemented by at least one air nozzle 24 placed over the film-like member 2. The air nozzle 24 linearly ejects uniform compressed air toward the upper surface of the film-like member 2, thereby applying its dynamic pressure so that the film-like member 2 becomes downwardly curved. The film-like member 2 in an arc shape (the imaginary line) is changed in shape in a portion subjected to the ejection and in its vicinity by the dynamic pressure due to the ejection of compressed air from the air nozzle 24. The shape of the film-like member 2 is changed to a flat shape as illustrated in FIG. 4, whereby suction can be achieved by the pads 10 including the one in the middle and the film-like member 2 can be maintained in the flat shape (the solid line).

The position and the number of air nozzles 24 should be determined by the material, characteristics, deformation amount, or the like of the film-like member 2 but may be determined according to experimental results obtained in advance using the film-like member 2 which is to be actually produced. The structure, function, and the like of the air nozzle 24 are disclosed in Japanese Published Patent Application No. H10-337503 or the like and are therefore not described here. Note that the air nozzle 24 having a plurality of ejection outlets arranged linearly may be replaced as appropriate with a plurality of commonly used air nozzles each having a single ejection outlet. In other words, the air nozzle 24 does not need to have a special structure or function, and the number and position thereof should be determined as needed by the deformed shape or position of the film-like member 2.

Embodiment 3

Figure 5:
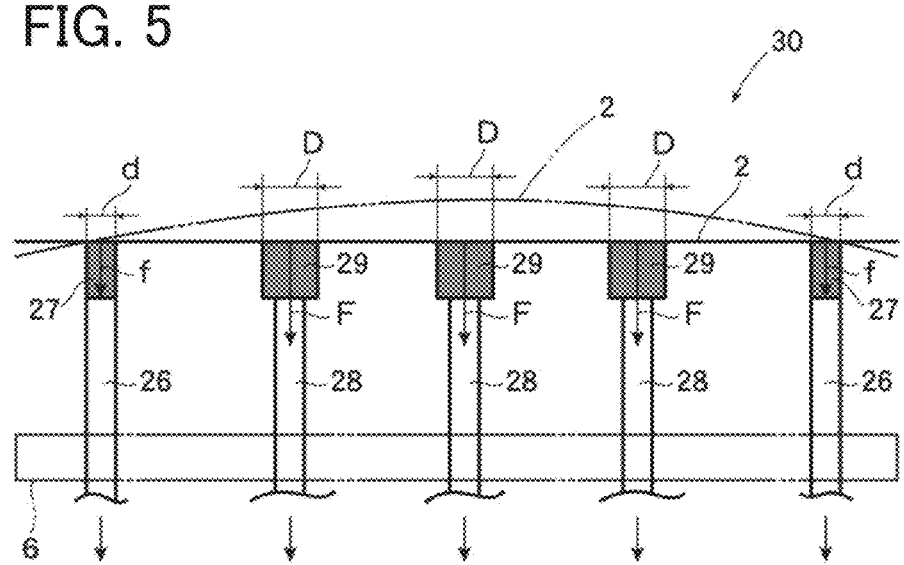
FIG. 5 is a side view illustrating a film-like member support apparatus in Embodiment 3 of the present invention.

In each of the support apparatuses 1, 20, and 25 described in Embodiments 1 and 2, the six lift pins 5 have the same specifications. A support apparatus 30 in Embodiment 3 illustrated in FIG. 5 is an example in which a total of 10 lift pins are provided. In the support apparatus 30, suction portions at upper ends of two lift pins 26 at both ends and those of three lift pins 28 in the middle have different diameters. The diameter d of each of the two lift pins 26 at both ends is smaller than the diameter D of each of the three lift pins 28 in the middle. FIG. 6 is a partial cross-sectional view of a pad over each of the two lift pins 26 at both ends and that over each of the three lift pins 28 in the middle. The inner diameter a of a suction hole of a pad 27 of each of the two lift pins 26 at both ends is smaller than the inner diameter A of that of a pad 29 of each of the three lift pins 28 in the middle. Owing to a difference in suction area therebetween, the suction force f of the pad 27 of each of the two lift pins 26 at both ends is weaker than the suction force F of the pad 29 of each of the three lift pins 28 in the middle.

Even when the film-like member 2 tends to be convexly curved in the middle as illustrated in FIG. 5, the film-like member 2 can be easily held owing to the relatively strong suction force of the three lift pins 28 in the middle. In addition, the two lift pins 26 at both ends have a relatively small diameter d, i.e., external diameter, and therefore can easily conform to deformed shapes of both ends of the film-like member 2 as illustrated in FIG. 7. Note that the suction force F is set so as not to cause damage to the film-like member 2.

Other Embodiments

All the support apparatuses 1, 20, 25, and 30 described above in Embodiments 1 to 3 are based on the premise that they do not move. However, these support apparatuses 1, 20, 25, and 30 may be capable of moving uniaxially, biaxially, or triaxially and capable of controlling the move by NC or the like when necessary in a plate-like product manufacturing system. In other words, the support apparatuses 1, 20, 25, and 30 may have a function of a transfer apparatus. Furthermore, the support apparatuses 1, 20, 25, and 30 described in Embodiments 1 to 3 hold the film-like member 2 horizontally thereover, but may bear the film-like member 2 upright (vertically) or thereunder. In other words, the support apparatus of the present invention may transfer and support a film-like member upright when it is large, in view of space efficiency or gravity, and although not illustrated, such cases are also included in the scope of the present invention.

EXPLANATION OF REFERENCE

1, 20, 25, 30: film-like member support apparatus, 2: film-like member, 3: frame, 5, 26, 28: lift pin, 6: upper plate stage, 10, 27, 29: pad, 12: upper end surface, 14: pipe conduit, 15: vacuum pump, and 24: air nozzle.

This application is based on Japanese Patent Application serial no. 2014-095582 filed with Japan Patent Office on May 3, 2014, the entire contents of which are hereby incorporated by reference.

The invention claimed is:

1. An apparatus for a film having a first surface and a second surface, comprising:
   a frame;
   a plurality of first lift pins fixed to the frame and each having a first height from the frame;
   a plurality of second lift pins fixed to a middle of the frame and each having a second height from the frame being smaller than the first height;
   a plurality of first pads each including an elastic member, and provided at end portions of the plurality of first lift pins; and
   a plurality of second pads each including an elastic member, and provided at end portions of the plurality of second lift pins,
   wherein two pads of the plurality of first pads which are positioned at both ends of the frame have a smaller external diameter than the rest of the plurality of first pads, and
   wherein the plurality of first pads and the plurality of second pads are configured to attach the first surface thereto by suction.

2. The apparatus according to claim 1, wherein the plurality of first pads have different suction forces depending on a bearing position of the film.

3. The apparatus according to claim 1, wherein each of the plurality of first pads is configured to bear the film at a point.

4. The apparatus according to claim 1, further comprising an air nozzle configured to blow air,
   wherein the plurality of first pads are configured to attach the first surface thereto by suction while the air is blown onto the second surface.

5. An apparatus for a film, comprising:
   a plurality of first lift pins each comprising an elastic member at an end portion;
   a plurality of second lift pins each comprising an elastic member at an end portion;
   a vacuum pump connected to each of the plurality of first lift pins and the plurality of second lift pins; and
   a mechanism for independently adjusting heights of the plurality of first lift pins and the plurality of second lift pins,
   wherein the plurality of first lift pins and the plurality of second lift pins are configured to suction air so that the film is held with the plurality of first lift pins and the plurality of second lift pins, and
   wherein the plurality of first lift pins have a smaller external diameter than the plurality of second lift pins.

6. The apparatus according to claim 5, wherein the plurality of first lift pins and the plurality of second lift pins have different suction forces depending on a bearing position of the film.

7. The apparatus according to claim 5, wherein each of the plurality of first lift pins is configured to bear the film at a point.

8. The apparatus according to claim 5, further comprising an air nozzle configured to blow air,
   wherein the plurality of first lift pins are configured to attach a surface of the film thereto by suction while the air is blown onto the opposite surface of the film.

9. An apparatus for a film having a first surface and a second surface, comprising:
   a frame;
   a first lift pin fixed to the frame;
   a second lift pin fixed to the frame;
   a first pad including an elastic member, and provided at an end portion of the first lift pin; and
   a second pad including an elastic member, and provided at an end portion of the second lift pin,
   wherein the first pad has a smaller external diameter than the second pad, and
   wherein the first pad and the second pad are configured to attach the first surface thereto by suction.

10. The apparatus according to claim 9, further comprising:
    a third lift pin fixed to the frame; and
    a third pad including an elastic member, and provided at an end portion of the third lift pin,
    wherein the third pad has a smaller external diameter than the second pad, and
    wherein the second lift pin is positioned between the first lift pin and the third lift pin.

11. The apparatus according to claim 9, wherein the suction force of the first pad is different from the suction force of the second pad.

12. The apparatus according to claim 9, wherein the first pad is configured to bear the film at a point.

13. The apparatus according to claim 9, further comprising an air nozzle configured to blow air,
    wherein the first pad is configured to attach the first surface thereto by suction while the air is blown onto the second surface.

* * * * *